United States Patent
Woo et al.

(10) Patent No.: US 7,479,786 B2
(45) Date of Patent: Jan. 20, 2009

(54) MEMBER FOR MEASUREMENT OF CELL VOLTAGE AND TEMPERATURE IN BATTERY PACK

(75) Inventors: Hyosang Woo, Daejeon (KR); JongMin Park, Daejeon (KR); Jaesung Ahn, Busan (KR); Do Yang Jung, Hwaseong-si (KR); John E. Namgoong, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 11/264,184

(22) Filed: Nov. 1, 2005

(65) Prior Publication Data

US 2006/0091891 A1    May 4, 2006

(30) Foreign Application Priority Data

Nov. 2, 2004    (KR) .................. 10-2004-0088523

(51) Int. Cl.
*G01N 27/416*    (2006.01)
*H02J 7/04*    (2006.01)
*H02J 7/00*    (2006.01)

(52) U.S. Cl. ............... 324/431; 320/154; 307/75; 307/150

(58) Field of Classification Search ........... 324/431, 324/426; 307/75, 150; 320/154
See application file for complete search history.

(56) References Cited

U.S. PATENT DOCUMENTS

| | | | | |
|---|---|---|---|---|
| 6,020,722 A | * | 2/2000 | Freiman | 320/164 |
| 6,919,725 B2 | * | 7/2005 | Bertness et al. | 324/433 |
| 2002/0040409 A1 | * | 4/2002 | Matena et al. | 709/315 |
| 2002/0070709 A1 | * | 6/2002 | Small et al. | 320/150 |
| 2005/0100783 A1 | * | 5/2005 | Ro et al. | |

FOREIGN PATENT DOCUMENTS

KR    10-2004-0005066    1/2004

\* cited by examiner

*Primary Examiner*—Gary L Laxton
*Assistant Examiner*—Yalkew Fantu
(74) *Attorney, Agent, or Firm*—Cantor Colburn LLP

(57) ABSTRACT

A member for measurement of cell voltage and temperature in a battery pack comprises temperature measuring elements (a) attached to the surfaces of unit cells, and a printed circuit board (b) having protrusions formed at the upper end thereof such that the protrusions are connected to electrode lead connection members that connect electrode leads of the unit cells, connection parts formed at the lower part thereof for allowing the temperature measuring elements to be attached to the printed circuit board, and a circuit through which electric current for voltage measurement of the unit cells and electric current for temperature measurement of the temperature measuring elements flow.

8 Claims, 3 Drawing Sheets

MEMBER FOR MEASUREMENT OF CELL VOLTAGE AND TEMPERATURE IN BATTERY PACK

FIELD OF THE INVENTION

The present invention relates to a member for measurement of cell voltage and temperature in a battery pack, and, more particularly, to a member for measurement of cell voltage and temperature in a high-output, large-capacity battery pack having a plurality of unit cells, which are electrically connected with each other, the voltage and temperature measuring member being attached to electrode lead connection members that connect electrode leads of the unit cells with each other for simultaneously measuring voltage and temperature of the unit cells.

BACKGROUND OF THE INVENTION

Recently, a secondary battery, which can be charged and discharged, has been widely used as an energy source for wireless mobile devices. Also, the secondary battery has attracted considerable attention as a power source for electric vehicles and hybrid electric vehicles, which haven been developed to solve problems, such as air pollution, caused by the existing gasoline and diesel vehicles using fossil fuel.

Small-sized mobile devices use one or more unit cells, for example, three or four unit cells, for each device. To the contrary, medium- or large-sized devices, such as vehicles, use a battery pack comprising a plurality of unit cells electrically connected with each other because a high-output, large-capacity battery is required for the medium- or large-sized devices.

Generally, a plurality of unit cells, which are connected in series or parallel with each other, are mounted in a cartridge, and a plurality of such cartridges are connected in parallel with each other, whereby a battery pack is manufactured.

FIG. 1 is a perspective view illustrating an exemplary structure of a cartridge having four unit cells mounted therein.

Referring to FIG. 1, the cartridge 100 comprises a pair of frames 102 and 104, which are attached to each other. The unit cells 200 are located in cell partitions 110 of the frames 102 and 104 while the frames 102 and 104 are separated from each other, and are then securely fixed at the cell partitions 110 of the frames 102 and 104 after the frames 102 and 104 are attached to each other. The unit cell 200 has an electrode lead, which is electrically connected to that of a neighboring unit cell 201 via a bus bar 120 located at the upper part of the cartridge 100. As shown in FIG. 1, the unit cells 200 and 201 are connected in series with each other, although the unit cells may be connected in parallel with each other. The unit cells are electrically connected to a cathode terminal 130 and an anode terminal 140, which protrude at opposite sides of the upper end of the cartridge 10, respectively.

A conventional method of measuring the voltage and the temperature of the unit cells 200 and 201 in a battery pack having two or more cartridges 200, which are electrically connected with each other while being stacked one on another, comprises the steps of: attaching an additional voltage measuring device to electrode lead connection members via wires to measure the cell voltage; and attaching thermocouples to the cell surfaces or in the vicinity of the cell surfaces and connecting the thermocouples to an external measuring device via a wire to measure the cell temperature. Consequently, external wiring members, such as the above-mentioned wires for the connection of the voltage and temperature measuring devices, are required for the battery pack, and as a result, the structure of the battery pack is more complicated. Complicated wiring makes it difficult to assemble the battery pack, and is a principal cause of trouble. Such complicated wiring may be simplified by the provision of a printed circuit board.

An example of printed circuit boards used in high-output, large-capacity battery packs is disclosed in Korean Unexamined Patent Publication No. 2002-39356 in which a printed circuit board is used as a connection member for the unit cells. The invention disclosed in this publication provides a method of directly connecting the printed circuit board, which includes an electric circuit necessary for connection in series or parallel of the unit cells mounted therein and a voltage measurement-purpose connection socket, to which a voltage measuring device is connected, to the unit cells.

When the printed circuit board is directly used as the electrical connection member of the unit cells as described above, however, the entire battery pack may short-circuit even when the printed circuit board is partially damaged. Also, the connection of the printed circuit board and the unit cells reduced durability. Furthermore, the disclosed invention has the problem in that the measurement of cell temperature in the battery pack is performed through the additional external wire as described above.

SUMMARY OF THE INVENTION

Accordingly, the present invention is directed to a member for measurement of cell voltage and temperature in a battery pack that substantially obviates the above-mentioned problems of the conventional arts as well as the technical problems requested from the past. That is to say, it is an object of the present invention to provide a printed circuit board that is easily connected to electric connection members of unit cells in the battery pack for simultaneously measuring cell voltage and temperature without the provision of an additional wire.

The inventors have performed various experiments and research, and have newly developed a measuring member that can be attached to additional connection members of the unit cells of the battery pack, not the electric connection members of the unit cells, can be used irrespective of kinds of the connection members, and simultaneously performs the voltage and temperature measurement without the provision of an additional wire.

In accordance with the present invention, the above and other objects can be accomplished by the provision of a member for measurement of cell voltage and temperature in a battery pack, comprising: temperature measuring elements (a) attached to the surfaces of unit cells; and a printed circuit board (b) having protrusions formed at the upper end thereof such that the protrusions are connected to electrode lead connection members that connect electrode leads of the unit cells, connection parts formed at the lower part thereof for allowing the temperature measuring elements to be attached to the printed circuit board, and a circuit through which electric current for voltage measurement of the unit cells and electric current for temperature measurement of the temperature measuring elements flow.

Consequently, the voltage and temperature measuring member according to the present invention has a structure in which the temperature measuring elements are attached to the printed circuit board, which is formed in a specific shape. The attachment of the voltage and temperature measuring member is easily accomplished by attaching the voltage and temperature measuring member to the electrode wire connection members such that temperature measuring elements are located on the unit cells of the battery pack. Consequently, the voltage and temperature measuring member according to the present invention does not require external wiring members, such as wires for voltage and temperature measurement, and, when the voltage and temperature measuring member is damaged, the damaged voltage and temperature measuring member is easily and conveniently replaced by a new one without the occurrence of a short circuit of the battery pack, and contact resistance, which may be generated due to direct connection between the voltage and temperature measuring member and the electrode leads, is reduced.

Preferably, each of the temperature measuring elements (a) is a thermistor, the resistance of which is changed according to the temperature.

The protrusions of the printed circuit board (b) may be fixed to the electrode lead connection members in various manners. Preferably, the protrusions are fixed to the electrode lead connection members by soldering. The temperature measuring elements (a) may be fixed to the printed circuit board (b) in various manners. Preferably, each of the connection part of the printed circuit board (b) has through-holes, through which two connection feet of each of the temperature measuring elements (a) are inserted, and the connection feet of each of the temperature measuring elements are fixed to the printed circuit board by soldering while the connection feet of each of the temperature measuring elements (a) are inserted in the through-holes.

The printed circuit board is provided at one end thereof with a connector, which is connected to a battery management system (BMS), at which a voltage measuring device and a temperature measuring device are mounted.

The electrode lead connection members, to which the protrusions of the printed circuit board (b) are not particularly restricted. Preferably, the electrode lead connection members are bus bars.

BRIEF DESCRIPTION OF THE DRAWINGS

The above and other objects, features and other advantages of the present invention will be more clearly understood from the following detailed description taken in conjunction with the accompanying drawings, in which.

Figure 1:
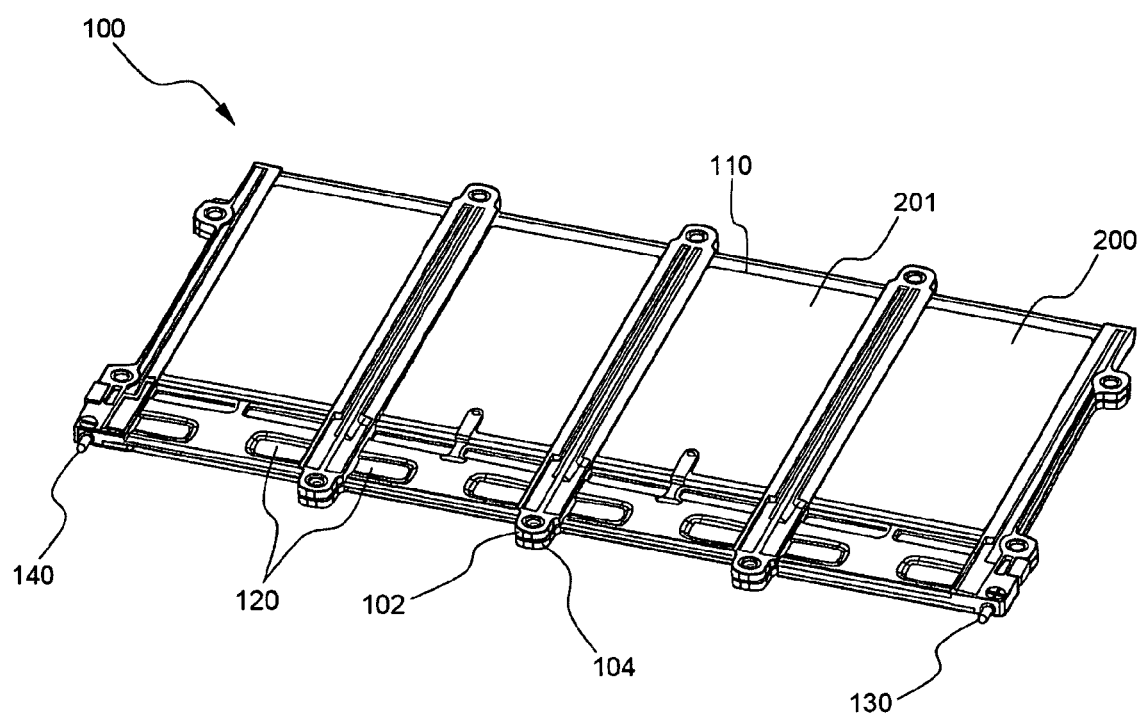
FIG. 1 is a perspective view illustrating a cartridge having four unit cells mounted therein.

DESCRIPTION OF MAIN REFERENCE
NUMERALS OF THE DRAWINGS

100: battery pack cartridge
120, 121, 122, 123: bus bars
200, 201, 202, 203: unit cells
211,212: cathode leads
220,221: anode terminals
300: voltage and temperature measuring member
310: thermistor
320: printed circuit board

DETAILED DESCRIPTION OF PREFERRED
EMBODIMENTS

Now, a preferred embodiment of the present invention will be described in detail with reference to the accompanying drawings. It should be noted, however, that the scope of the present invention is not limited by the illustrated embodiment.

Figure 2:
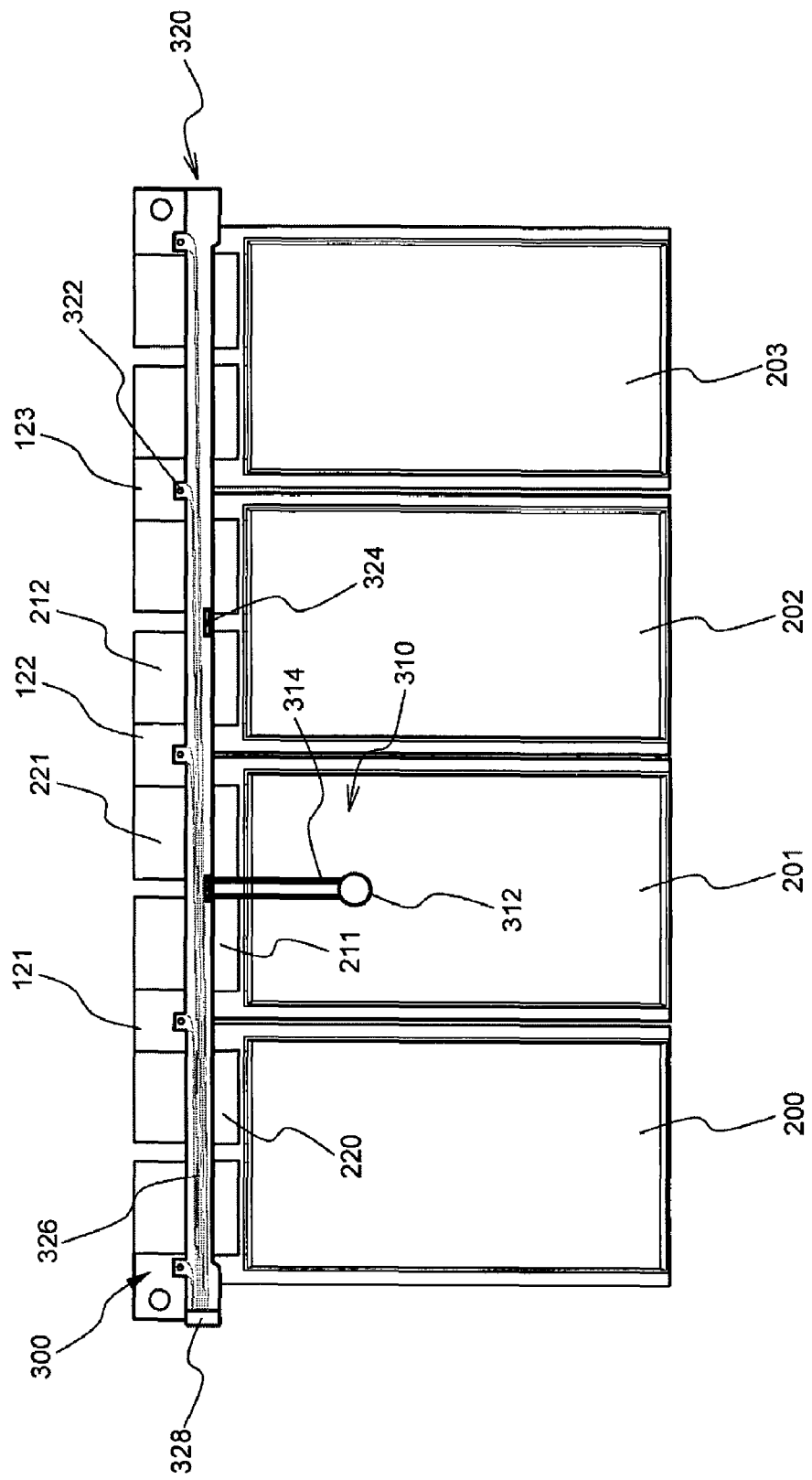
FIG. 2 is a typical view illustrating a voltage and temperature measuring member according to a preferred embodiment of the present invention, which is attached to bus bars.
Figure 3:
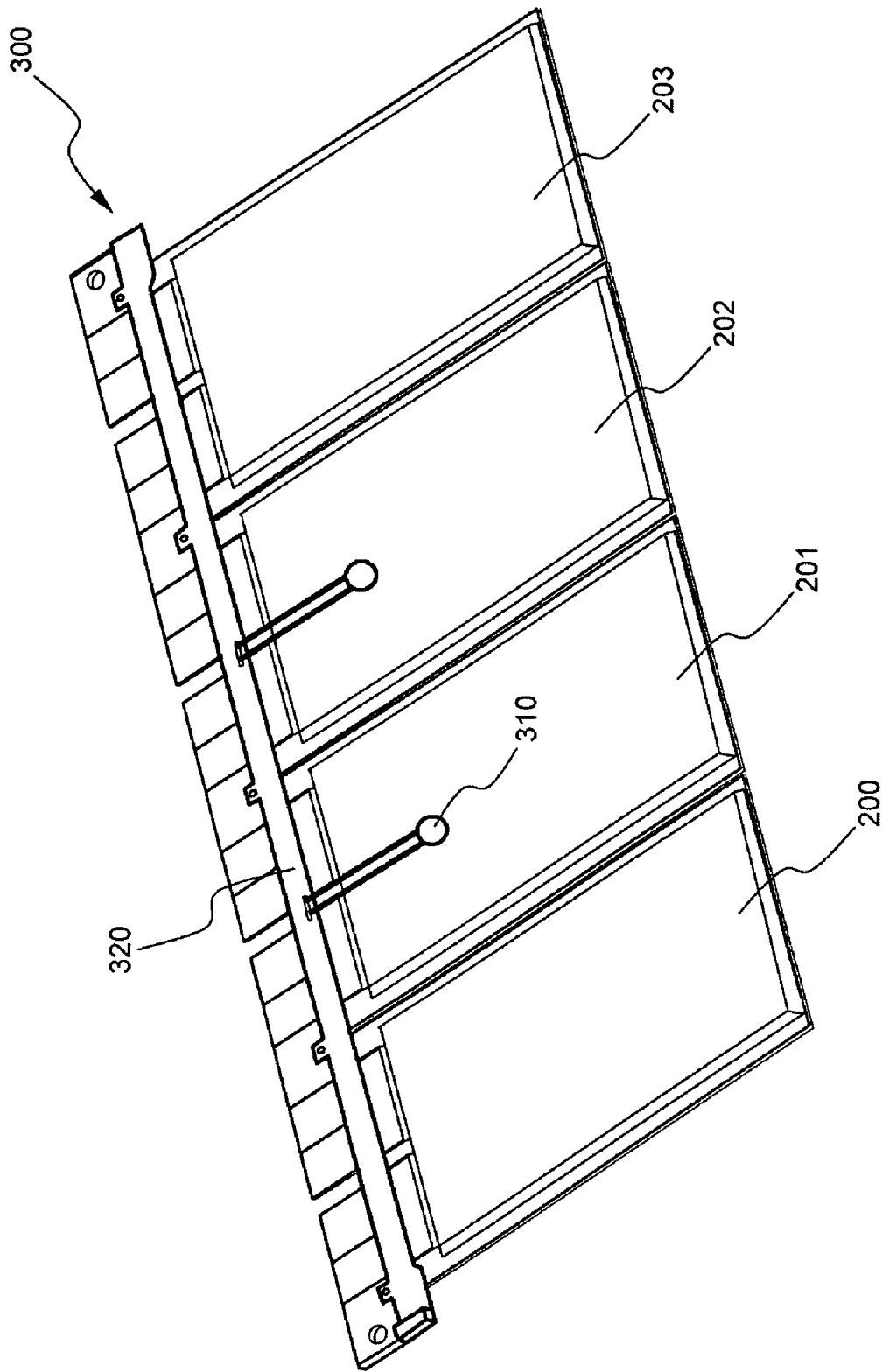
FIG. 3 is a perspective view of FIG. 2.

FIG. 2 is a typical view illustrating a voltage and temperature measuring member 300 according to a preferred embodiment of the present invention, which is attached to bus bars 121, 122, and 123, and FIG. 3 is a perspective view of FIG. 2. The voltage and temperature measuring member 300 attached to the bus bars 121, 122, and 123 is securely fixed to the cartridge frame shown in FIG. 1 to constitute a battery pack. For the purpose of clear understanding, the cartridge frame is not shown in FIGS. 2 and 3.

Referring to FIGS. 2 and 3, four unit cells 200, 201, 202, and 203 have electrode leads, each of which is connected to that of the neighboring unit cell via the corresponding one of the bus bars 121, 122, and 123. For example, the unit cell 201 has a cathode terminal 211, which is connected to an anode terminal 220 of the unit cell 200, and an anode terminal 221, which is connected to a cathode terminal 212 of the unit cell 202 via the bus bar 122.

The unit cells 200, 201, 202, and 203 are cells that can be charged and discharged. Various kinds of cells may be used as the unit cells. Preferably, square-shaped cells or pouch-shaped cells, which accumulate electricity in high density, are used as the unit cells. More preferably, the pouch-shaped cells are used as the unit cells.

Each of the unit cells has a cathode, an anode, a separation film, and an electrolyte mounted in a cell case in a sealed manner. An electrode assembly including a minute porous separation film between thin film-shaped cathode and anode may be wound, or fullcells or bicells of cathode/separation film/anode structure may be sequentially stacked one on another. Active materials applied to the cathode and the anode are not particularly restricted. Preferably, the cathode active material consists of lithium manganese-based oxide having high safety, and the anode active material consists of carbon. The most preferable unit cell is a lithium-ion cell or a lithium-ion polymer cell.

Referring back to FIGS. 2 and 3, the measuring member 300 according to the present invention comprises: thermistors 310, which serve as temperature measuring elements, and a printed circuit board 320.

Each of the thermistors 310 includes a sensing body 312 attached to the secondary cell 201 to be measured and a pair of connection feet 314 extending from the sending body 312. The connection feet 314 are made of a thin conductive wire. The sensing body 312 is attached to the surface of the secondary cell 201 while the connection feet 314 are connected to the printed circuit board 320. Electric current is applied to the sensing body 312, the resistance of which is changed according to the temperature, through the connection feet 314, and the electric current, which is changed according to the resistance, is transmitted to the printed circuit board 320 as an electric signal.

The printed circuit board 320 is made of a thin copper laminate. The printed circuit board has a plurality of protrusions 322 formed at the upper end thereof such that the protrusions 322 are connected to the bus bar 121, 122, and 123, respectively. The protrusions 322, which are conductive, are fixed to the bus bars 121, 122, and 123 by soldering such that the electric current flowing through the bus bars 121, 122, and 123 is transmitted to the protrusion 322. At the lower part of the printed circuit board 320 are formed a plurality of through-holes 324, through which the connection feet 314 of the thermistor 310 are inserted. While the connection feet 314 of the thermistor 310 are inserted through the through-holes 324, the connection feet 314 is fixed to the printed circuit board 320 by soldering.

At the printed circuit board is printed a circuit 326, to which electric current is transmitted from the bus bar 120 via the protrusions 322 and electric current is transmitted from the thermistor 310 via the through-holes 324.

At one end of the printed circuit board 320, to which the circuit 326 is connected, is mounted a connector 328, which is connected a battery management system (BMS) (not shown), at which a voltage measuring device and a temperature measuring device are mounted.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, the cell voltage and temperature measuring member according to the present invention is easily connected to the electrode lead connection members that connect the electrode leads of the unit cells attached to the cartridge constituting the battery pack for measuring the cell voltage. Furthermore, the cell temperature is accurately measured by the temperature measuring element directly connected to the printed circuit board without the provision of the additional external wire. When the printed circuit board is damaged, the damaged printed circuit board does not affect the electrode lead connection members. Consequently, the printed circuit board is easily replaced without the occurrence of a short circuit of the battery pack.

What is claimed is:

1. A member for measurement of cell voltage and temperature in a battery pack, comprising:
   temperature measuring elements (a) adapted for being attached to the surfaces of unit cells of the battery pack, wherein each of the temperature measuring elements comprise a sensing body coupled to connection feet; and
   a printed circuit board (b) having protrusions formed at an upper end thereof such that the protrusions are suited for connecting to electrode lead connection members that connect electrode leads of the unit cells, the electrode lead connection members being bus bars connecting the electrode leads, the printed circuit board comprising connection parts formed at a lower part thereof for connecting the temperature measuring elements to the printed circuit board, and a circuit for transmitting electric current for voltage measurement of the unit cells and electric current for temperature measurement of the temperature measuring elements;
   wherein attachment of the voltage and temperature measuring member to the battery pack is accomplished by attaching the protrusion of the voltage and temperature measuring member to the bus bars of the battery pack such that temperature measuring elements are located on the unit cells of the battery pack.

2. The member as set forth in claim 1, wherein each of the temperature measuring elements is a thermistor, the resistance of which is changed according to the temperature.

3. The member as set forth in claim 1, wherein the protrusions are fixed to the electrode lead connection members by soldering.

4. The member as set forth in claim 1, wherein each of the connection parts has through-holes, through which two connection feet of each of the temperature measuring elements are inserted, the connection feet of each of the temperature measuring elements being fixed to the printed circuit board by soldering while the connection feet of each of the temperature measuring elements are inserted in the through-holes.

5. The member as set forth in claim 1, wherein the printed circuit board is provided at one end thereof with a connector, which is adapted for connection to a battery management system (BMS), at which a voltage measuring device and a temperature measuring device are mounted.

6. The member as set forth in claim 1, wherein the printed circuit board is adapted for connection to the electric connection members without an additional wire.

7. The member as set forth in claim 1, wherein the units cells comprise at least one of square-shaped cells and pouch-shaped cells.

8. The member as set forth in claim 1, wherein the units cells comprise rechargeable cells.

* * * * *